United States Patent
Woll et al.

(10) Patent No.: US 6,768,048 B2
(45) Date of Patent: Jul. 27, 2004

(54) SOL-GEL COATINGS FOR SOLAR CELLS

(75) Inventors: Suzanne L. B. Woll, Manchester, CT (US); Kay Y. Blohowiak, Issaquah, WA (US); David E. Harden, Bonney Lake, WA (US); Harold G. Pippin, University Place, WA (US); Larry K. Olli, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/309,710

(22) Filed: Dec. 4, 2002

(65) Prior Publication Data

US 2004/0107989 A1 Jun. 10, 2004

(51) Int. Cl.⁷ ................. H01L 31/048; H01L 31/18
(52) U.S. Cl. ................. 136/251; 136/256; 136/261; 136/262; 438/64; 438/93; 257/433; 257/434; 257/435
(58) Field of Search ................. 136/251, 256, 136/261, 262; 438/64, 93; 257/433, 434, 435

(56) References Cited

U.S. PATENT DOCUMENTS

| | | | | |
|---|---|---|---|---|
| 5,182,143 A | * | 1/1993 | Holmes-Farley et al. | ... 427/409 |
| 5,789,085 A | | 8/1998 | Blohowiak et al. | |
| 5,814,137 A | | 9/1998 | Blohowiak et al. | |
| 5,849,110 A | | 12/1998 | Blohowiak et al. | |
| 6,124,039 A | * | 9/2000 | Goetz et al. | ................ 428/457 |

FOREIGN PATENT DOCUMENTS

| | | | |
|---|---|---|---|
| JP | 6-320660 | * | 11/1994 |
| JP | 9-268382 A | * | 10/1997 |

* cited by examiner

*Primary Examiner*—Alan Diamond

(57) ABSTRACT

Methods for formulating and depositing a sol-gel coating onto a surface of a solar cell to provide improved radiation damage resistance. The sol-gel contains a solvent, alkoxyzirconium and an organosilane, with an organic acid catalyst and optionally a surfactant. The sol-gel coating can be deposited by spraying and the sol-gel coating is cured. The invention reduces manufacturing steps and overall weight of the solar cell array.

40 Claims, 6 Drawing Sheets

FIGURE 1 "PRIOR ART"

Transmittance of Sol-Gel

SOL-GEL COATINGS FOR SOLAR CELLS

TECHNICAL FIELD

The present invention relates to coverings for solar cells and mole specifically to sol-gel coatings for solar cells.

BACKGROUND OF THE INVENTION

Solar cell technology is continuing to develop as a renewable and sustainable energy option. Generally, a solar cell converts radiant energy into usable electrical energy. When in use, solar cells are typically shielded from damaging effects of the environment, such as radiation, by a protective device or covering on the surface of the solar cells. Currently, glass coverings are applied to the surfaces of the solar cells. The glass cover is often heavy and fragile however, and may include a labor-intensive installation process. A typical glass cover slide is a slide that ranges from about 2 to about 12 milli-inches (hereafter "mils") in thickness to allow processing without breakage, and a silicone liquid or pressure Sensitive adhesive to attach the slide that ranges from about 2 to about 3 mils in thickness. Glass cover slide systems, however, contribute to the overall weight of a solar cell array, complicate the manufacturing process and increase the likelihood of breakage due to the fragile quality of the glass.

Therefore, there is a need in the art for a light weight, durable protective coating for solar cells and provide adequate radiation damage resistance. There is also a need in the art for a simplified method of providing solar cell protection and electrical insulation which is transparent over a wavelength range suitable for transmitting radiant energy into the solar cell. There is a further need in the art for a protective layer for use as a dielectric separator between solar cell substrates in multi-junction solar cells.

SUMMARY OF THE INVENTION

Methods for providing solar cells having improved radiation damage resistance by applying sol-gel coatings onto the surface of the solar cells. The sol-gel coatings transmit an acceptable level of radiant energy into the solar cell while providing adequate radiation damage resistance. In one embodiment, a method for preparing a coating is disclosed comprising a water-borne binder system, such as a silicon-zirconium binder system, to form a sol-gel coating on a surface of a solar cell. The sol-gel coating provides a lightweight and durable solar cell surface coating that transmits radiant energy into the solar cell while providing adequate radiation damage resistance.

In an additional embodiment, a method for preparing a sol-gel coating for a solar cell is disclosed comprised of mixing organosilane, zirconium alkoxide, a catalyst such as acetic acid, a solvent such as water and optionally surfactant, wherein ratio of organosilane to zirconium alkoxide is about 1 part organosilane to about 2 parts zirconium alkoxide to form a sol-gel solution. The sol-gel solution may be concentrated to form a sol-gel coating which can be applied to and cured on a surface of a solar cell.

In an additional embodiment, a method of depositing a sol-gel coating onto a surface of a solar cell is provided comprising spraying a water-borne sol-gel coating onto a surface of a solar cell to form a sol-gel coating of suitable dimension.

In other embodiments, products of the disclosed methods are provided which include solar cells, such as gallium arsenide solar cells, having improved radiation damage resistance.

While the principal advantages and features of the present invention have been described above, other features and advantages and a more complete and thorough understanding of the invention may be attained by referring to the brief description of the drawings, detailed description and appended claims and drawings.

BRIEF DESCRIPTION OF THE DRAWINGS

Referring now to the drawings which are meant to be exemplary and not limiting.

DETAILED DESCRIPTION OF THE PREFERRED EMBODIMENT

Described herein are methods for providing solar cells having improved radiation damage resistance by preparing and depositing sol-gel coatings on their surfaces. The present invention further relates to a sol-gel coating which is lightweight, durable and suitably transparent under terrestrial and space environment conditions. The solar cells of the present invention further provide adequate protection from damaging effects of various elements of the environments, such as thermal cycling, vacuum, and more particularly, radiation. Thermal cycling of the material system is damaging because it may cause shearing, buckling and peeling. Vacuum conditions may cause out-gassing and embrittle the material. Radiation is damaging as both energy and particles. The sol-gel coated solar cells of the present invention provide a modicum of impact and particulate resistance. Terrestrial environments present additional damaging factors such as climate, rain, dust and wind. Therefore, the sol-gel coating, in space and terrestrial applications, provides a solar cell with adequate particulate resistance and protection.

The term "solar cell" as used herein refers to a device which converts solar energy into electrical energy, either directly as in the photovoltaic effect or indirectly by converting the solar energy into heat or chemical energy, and is given the ordinary meaning known to persons skilled in tile art.

In one embodiment of the present invention, a sol-gel coating for a solar cell is provided. The term "sol-gel" is a contraction of the terms "solution" and "gelation" and refers to materials undergoing a series of reactions, including hydrolyzation and condensation. Typically, a metal, such as a metal alkoxide or metal salt, hydrolyzes to form a metal hydroxide. The metal hydroxides then condense in solution to form a hybrid organic/inorganic polymer.

Under certain conditions, these polymers condense to form colloidal particles or a network gel. The ratio of inorganic to organic in the polymer matrix of the sol-gel coating may be controlled to maximize performance for a particular application. For instance, increasing the amount of organic groups may improve the durability and flexibility of a sol-gel coating. Conversely, increasing the organic fraction in tile coating may also make the coating more susceptible to degradation and yellowing, particularly in a space environment. The photovoltaic effect of a typical sol-gel coated solar cell may be impaired if the transparency of the coating is adversely affected by degradation and yellowing. In a space and terrestrial environments, a balance between the processability of the coating and tie amount of resistance to the damage of the environment should be met.

Figure 1:
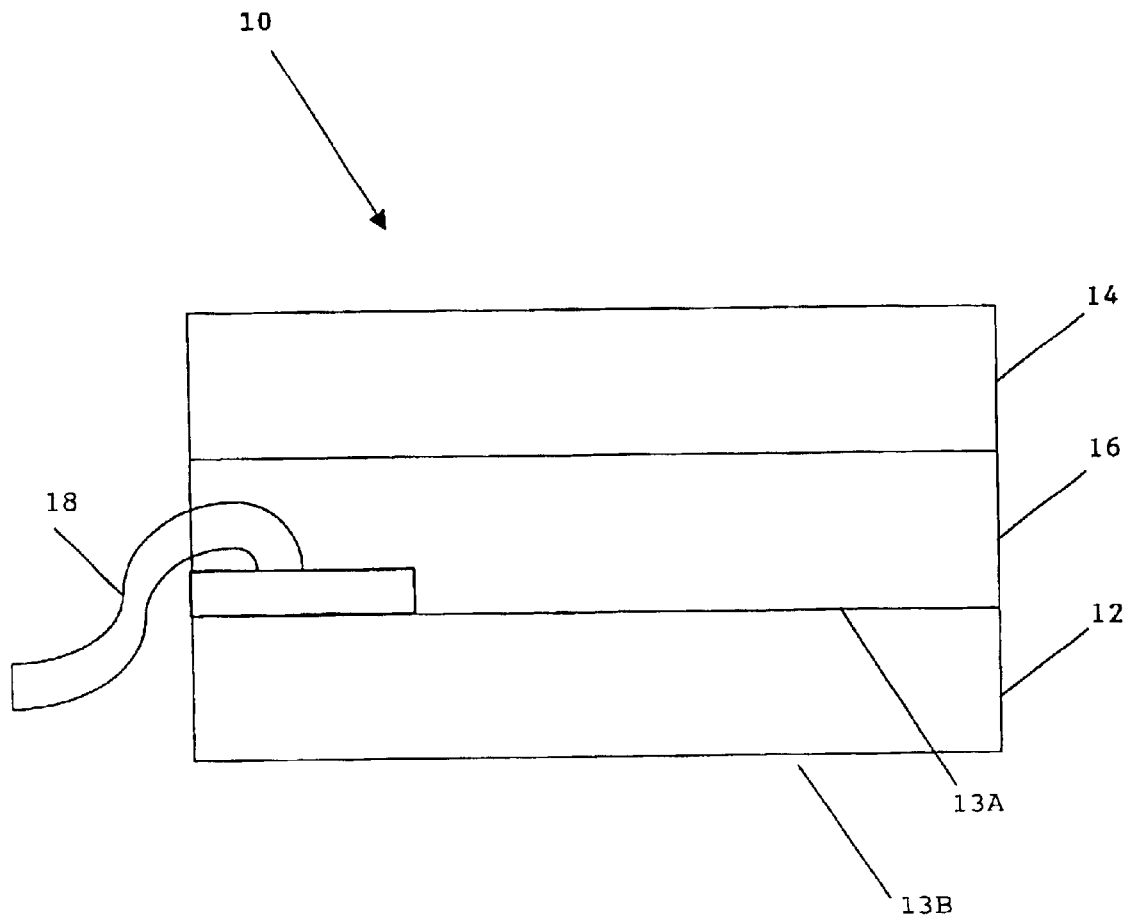
FIG. 1 is a schematic view of a solar cell having a glass cover and adhesive in accordance with the prior art.

Typically, as shown in FIG. 1, prior art system 10 protect the solar cell with glass coverings 14. The glass coverings 14 range from about 2 to about 12 mils in thickness and are secured onto the upper surfaces 13A of the solar cell 12 with an adhesive 16 that ranges from about 2 to about 3 mils in thickness. The total layered structure is typically about 4 to about 15 mils in thickness. The surface 13A of the solar cell 12 are positioned facing the sun, while the bottom surface 13B are radiative to ambient. Energy from the solar cells 12 is transferred to the electrical system of a craft such as a spacecraft or the like through the conductor 18. The glass cover 14 have a transparency of about 90% over a wavelength range of about 0.35 to about 1.6 micrometers (hereafter "$\mu m$"). This level of transparency permits radiant energy of the desired wavelength to transmit through the covering and into the solar cell for conversion into usable forms of electrical energy.

Figure 2:
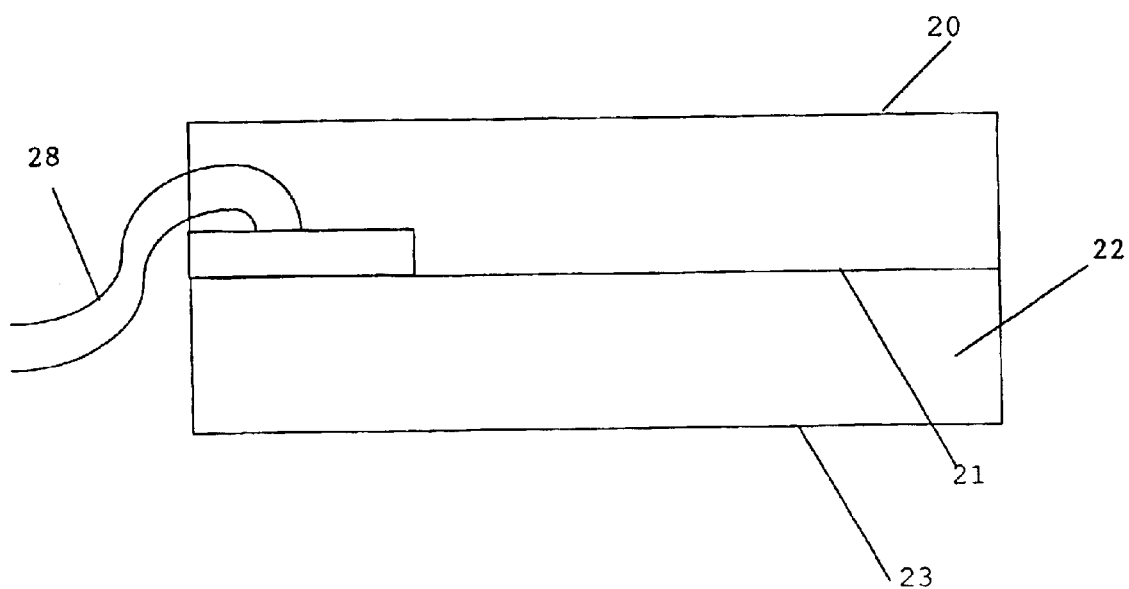
FIG. 2 is a schematic view of a solar cell coated with a sol-gel coating in accordance with the present invention.

With the present invention, as shown in FIG. 2, a sol-gel coating 20 is deposited on the exterior surfaces 21 of the solar cells 22 such as the collector surfaces. Not shown in this view, a sol-gel coating 20 may be deposited on the radiator surface 23 of the solar cell 22. The formulation of the sol-gel coating is such that it adheres to the exterior surface of the solar cell. The sol-gel coating may range from about 0.5 mils to about 10.0, preferably about 1.0 to about 2.0 mils in thickness. A sol-gel coating of about 0.5 to about 1.0 mils may provide minimal protection. Energy from the solar cells 22 is transferred to the electrical system of a craft such as a spacecraft or the like through the conductor 28.

Figure 3:
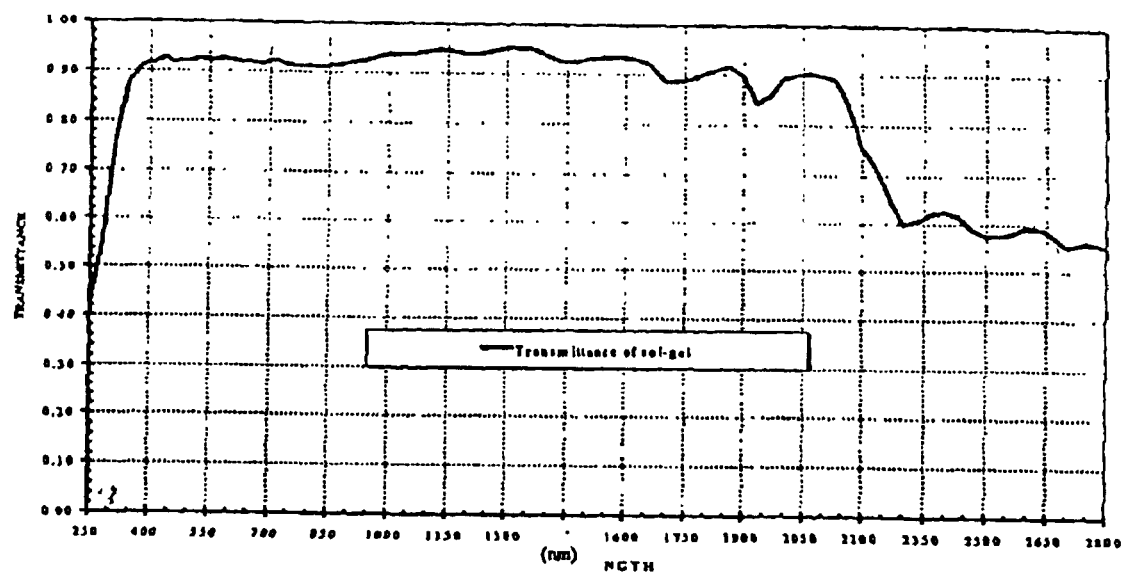
FIG. 3 is a graph depicting the radiation transmittance of a sol-gel coating in accordance with the present invention.

As shown in FIG. 3, sol-gel coatings in accordance with the present invention have greater than 90% transmittance over the wavelength range of about 350 nanometers (hereafter "nm") to about 1600 nm, which converts to wavelength values of about 0.35 $\mu m$ to about 1.6 $\mu m$, respectively. The sol-gel coatings measured about 1.0 to about 2.0 mils in thickness. The sol-gel coating is a suitable replacement for glass covering systems on solar cells.

The sol-gel coatings of the present invention are homogeneous mixtures of a solvent, an organosilane, alkoxide, and a catalyst which are processed to form a coating suitable for application on a solar cell. The term "homogeneous" as used herein refers to a form which has a uniform or similar structure throughout and is given the ordinary meaning know to persons skilled in the art. The sol-gel coatings may be deposited on a surface of a solar cell, such as a collector surface. The surface of the solar cell to which the sol-gel coating is applied is typically comprised of a semi-conductive material. The term "semi-conductive" as used herein refers to those materials which may become electrically conductive when supplied with energy, such as heat or light, but which may function as an insulator at low temperatures, and is given the ordinary meaning known to persons skilled in the art. However, the coating may be applied to other substrates which include metallic alloys, such as aluminum, 2024, 2219 and 6061, titanium alloys, such as Ti-6A1-4V and composite substrates, such as graphite-epoxy, graphite-cyanate ester.

In another embodiment, the sol-gel coating of the present invention includes a surfactant, which may enhance the wettability of the coating and improve adhesion of the coating to the surfaces of the solar cells. Often, an aqueous sol-gel solution may wet a surface unevenly and sag which results in thickness variations on the substrate. Including surfactant in the composition of the sot-gel provides a more evenly deposited sol-gel coating.

In a further embodiment, the sol-gel coating may include indium tin oxide (ITO). The (ITO) can dissipate static charge that can build up in the protective coating. Often, protective coatings are grounded to prevent discharge that could damage the solar cells. The addition of ITO to dope the coatings is useful in maintaining the sol-gel coatings and preserving the solar cells.

In an additional embodiment, the sol-gel coating is comprised of cerium, usually in a water-soluble form. The addition of cerium may absorb a portion of the ultraviolet radiation which can be harmful to the solar cell and/or the sol-gel coating. Suitable forms of cerium include cerium oxide, cerium acetate, cerium acetylacetonate, cerium 2-ethylhexonate, cerium hydroxide, cerium nitrate, cerium oxalate, cerium stearate, and cerium trifluoroacetylacetonate and mixtures thereof Other suitable forms of cerium will be known to one skilled in the art and may be included in the sol-gel composition.

A suitable organosilane includes 3-Glycidoxypropyltrimethoxysilane (GTMS). Other suitable organosilane for making the sol-gel coating include but are not limited to:

3-aminopropyltriethoxysilane
3-glycidoxy-propyltriethoxysilane
p-aminophenylsilane
allyltrimethoxysilane
n-(2-aminoethyl)-3-aminopropyltrimethoxysilane
3-aminopropyltriethoxysilane
3-aminopropyltrimethoxysilane
3-glycidoxypropyldiisopropylethoxysilane
(3-glycidoxypropyl)methyldiethoxysilane
3-glycidoxypropyltrimethoxysilane
3-mercaptopropyltrimethoxysilane
3-mercaptopropyltriethoxysilane
3-methacryloxypropylmethyldiethoxysilane
3-methacryloxypropylmethyldimethoxysilane
3-methacryloxypropyltrimethoxysilane
n-phenylaminopropyltrimethoxysilane
vinylmethyldiethoxysilane
vinyltriethoxysilane or
vinyltrimethoxysilane.

Zirconium compounds are also utilized in the sol-gel coatings. Suitable zirconium compounds include those having the general formula $(R-O)_4 Zr$ wherein R is lower aliphatic having 2 to 5 carbon atoms, especially normal aliphatic (alky groups), tetra n-zirconium, as well as branched aliphatic, alicyclic and aryl groups. For example, zirconium n-propoxide, approximately 70% in propanol (TPOZ) is suitable for the sol-gel coating formulation in accordance with the present invention.

Organic catalysts which can be used in the present invention include glacial acetic acid (GAA), certified ACS grade.

An acidic catalyst may promote the hydroysis reaction over the condensation reaction. Other acids, such as nitric acid are effective as a catalyst, but may not stabilize the zirconate as effectively as the acetate ion of acetic acid.

Optionally, the sol-gel coating formulation may comprise surfactant. Suitable surfactant includes S-405 LF Poly-Tergent from Olin Chemicals and other surfactant compounds which may enhance the wettability of the sol-gel coating.

A preferred method for making a sol-gel coating comprises mixing the components into deionized water to form a solution. The solution is then concentrated by removing the solvent. One method for removing the solvent is evaporating the solvent, more particularly roto-evaporating. The concentrated solution may be filtered to remove any small particulate. The sol-gel is then deposited onto the surface of the solar cells and cured to provide solar cells with a protective coating and improved radiation damage resistance.

A suitable sol-gel coating formulation is depicted in Example 1. It will be understood that the formulation listed in Example 1 is given for the purpose of illustration only and does not limit the invention:

Example 1

| Component | Amount |
| --- | --- |
| Deionized Water | 400 mL |
| 3-glycidoxypropyltrimethoxysilane (GTMS) | 133.3 mL |
| zirconium n-propoxide (TPOZ) | 66.6 mL |
| acetic acid (GAA) | 30.0 mL |
| surfactant | 20 drops |

As depicted in Example 1, the components are mixed into 400 mL deionized water. The solution is then weighed and concentrated by roto-evaporation removing about 350 gm of the solution. The concentrated solution is vacuum filtered through a 0.2 micron filter. A suitable sol-gel coating concentration range for desired deposition, curing and mechanical properties is about 10% to about 40% solids, with 30% weight by concentration preferred. The computation of the concentration of the sol-gel coating is a comparative analysis of the weight of the sol-gel solution prior to the concentration step and the resulting concentrated sol-gel solution.

Figure 4:
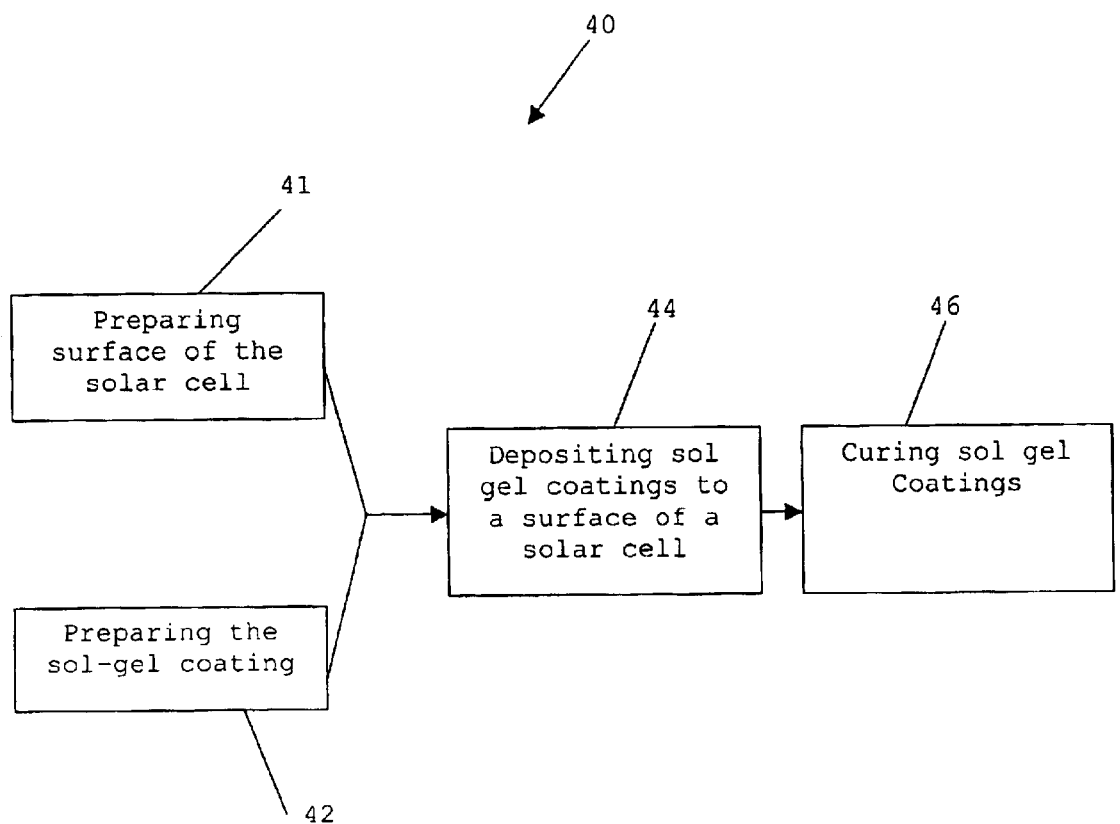
FIG. 4 is schematic view of a process for providing a solar cell having a sol-gel coating in accordance with the present invention.

The specific choice of sol-gel formulation may be determined based on the desired application. For the purposes of adhesion and cross-linking of the coating, the functional groups on the silane typically consist of active side group such as a modified epoxy. Shorter hydrocarbon chains of about 2 to about 5 carbons are preferred over a longer chain because of the weight and stability of the organic side group, particularly in a space environment. Conversely, some degree of organic functionality in the formulation may improve the processability of the coating. The ratio of organic to inorganic network can be modified by adjusting the relative amounts of organosilane and zirconate such as zirconium n-propoxide As shown in FIG. 4, a typical process of depositing a sol-gel coating to a surface of a solar cell to form a solar cell having a protective coating and improved radiation damage resistance, comprises preparing the surface of a solar cell by cleaning 40 to provide a desirable surface for adhesion of the sol-gel coating. Generally, this may be achieved by solvent wiping with, for example, isopropyl alcohol. Other cleaning and preparing compositions and methods of surface preparation will be known to persons skilled in the art.

As further shown in FIG. 4, the sol-gel formulation is prepared 42 prior to or concurrent with the step of cleaning 41 a surface of a solar cell. Generally, the sol-gel coating formulation of the present invention has a pot life of about 24 hours. The term "pot life" as used herein refers to the time period, after all of the sol-gel coating formulation components have been mixed and induction is complete, within which the coating material can be deposited 44 on the surface of a solar cell. Pot life can be extended as determined by appropriate storage conditions. The composition may be placed in cold storage or stored as components for extended shelf-life. The sol-gel is deposited 44 onto the surface of the solar cell (not shown) and the sol-gel coating is cured 46 to form a solar cell having a protective coating and improved radiation damage resistance.

The sol-gel coating can be applied onto the surface of the solar cells by spraying, dipping, brushing and any other suitable methods which will be known to persons skilled in the art. Spraying may be accomplished by using a conventional spray gun, high volume low pressure (HVLP) spray gun, or other suitable application device, such as a gravitational feed and siphoned feed gun, which will provide an acceptable surface. Typical sol-gel coatings range from less than about 1.0 mils to about 10.0 mils thick. The sol-gel can be applied by a series of successive layers or thin coats onto a surface to achieve the desired thickness and protection. Each layer or thin coat is allowed to flash off before depositing an additional layer or thin coat. The coating can then be cured under ambient conditions, such as by drying. To speed the manufacturing flow rates, the sol-gel coatings can be cured under elevated temperatures. The sol-gel coatings are equally effective when cured without elevated temperatures, which can reduce hardware fabrication costs and protect critical heat sensitive configurations.

Figure 5:
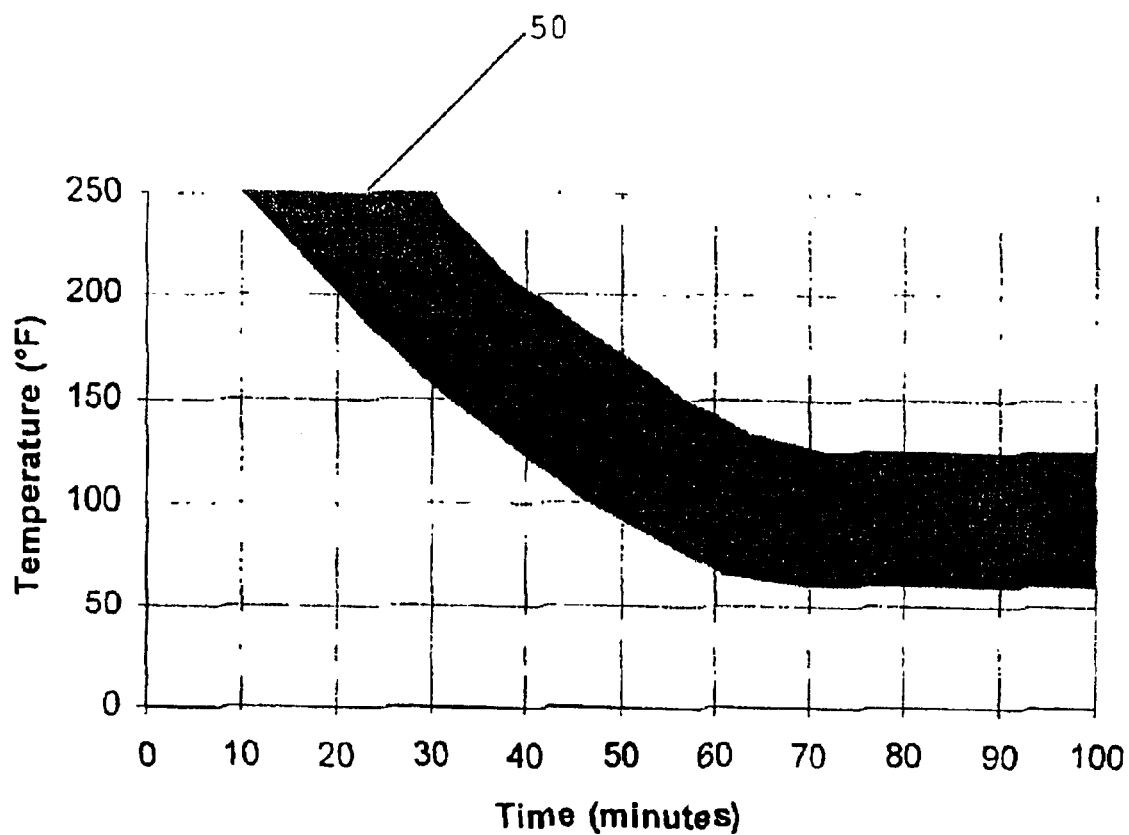
FIG. 5 is a graph depicting the time-temperature schedule for oven curing a sol-gel coating on a surface of a solar cell in accordance with the present invention.

Cure times for sol-gel coatings at ambient temperature range from 0 to 24 hours depending on the coating thickness. Heat curing may be accomplished by using a heat gun, heat lamps or other suitable methods to achieve the desired sol-gel coating. As shown in FIG. 5, sol-gel coated solar cells may be heat cured in an oven according to a time-temperature schedule. The specific curing time will be determined by the sol-gel coating configuration, and conditions of the curing area including temperature. The preferred curing conditions when using an oven are those within area 50 in FIG. 5.

The process of depositing a sol-gel coating onto a surface of a solar cell is preferably conducted in an area of adequate ventilation and ambient conditions. The temperature is about 75+/−10° F. and relative humidity is preferably about 85 percent or less.

The sol-gel coating ranges in thickness from less than about 1.0 to about 10.0 mils. A glass cover with adhesive protective coating on a solar cell ranges in thickness from about 4.0 to about 15.0 mils thick. The sol-gel coating and the glass cover with adhesive configuration have an estimated weight of about 2.6 grams/cubic centimeter (hereafter "g/cc") per mil. Therefore, replacing glass covers and adhesive configurations with a sol-gel coating may provide about 65% weight reduction.

Figure 6:
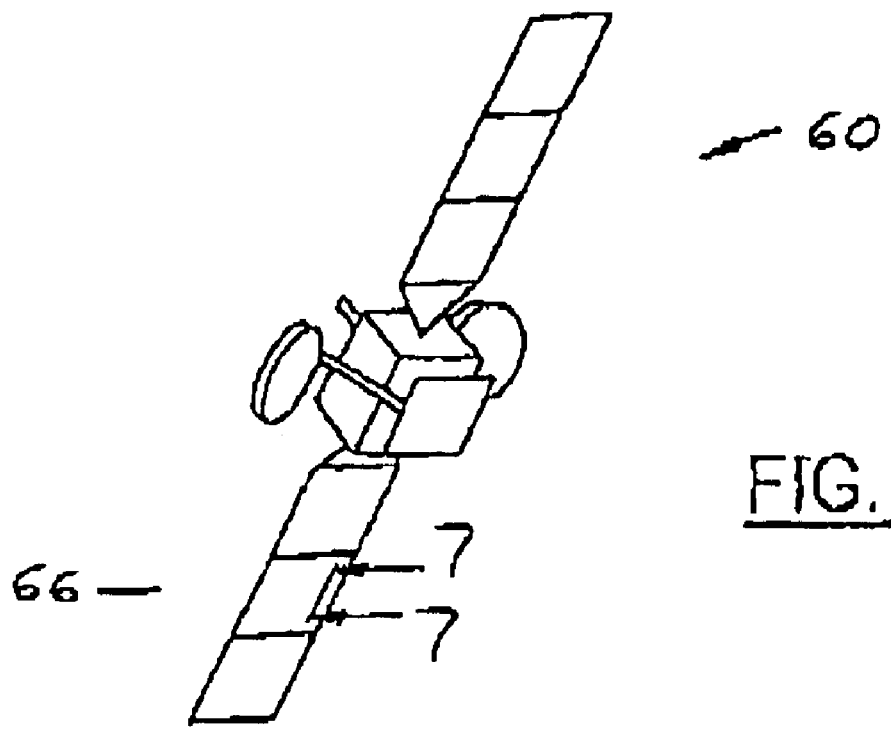
FIG. 6 is a schematic view of a satellite panel having six solar panels, each solar panel having a plurality of solar cells in accordance with the present invention.

As shown in FIG. 6, a representative satellite 60 having a solar array comprised of six solar panels 66 is shown. Solar panels 66 typically measure approximately 8 feet by 12 feet and comprise a plurality of solar cells, not shown in this view. In a typical satellite 60, each solar panel 66 may weigh about 1.02 pound/panel (hereafter "pound" is "lb."). Therefore, the weight of a satellite 60 with the present invention can be reduced from about 6.12 lbs. to about 2.12 lbs. The decrease in weight will enhance solar cell technology including multi-junction solar technology by decreasing launch costs while at the same time providing a solar cell having acceptable radiation transmission and radiation damage protection.

Figure 7:
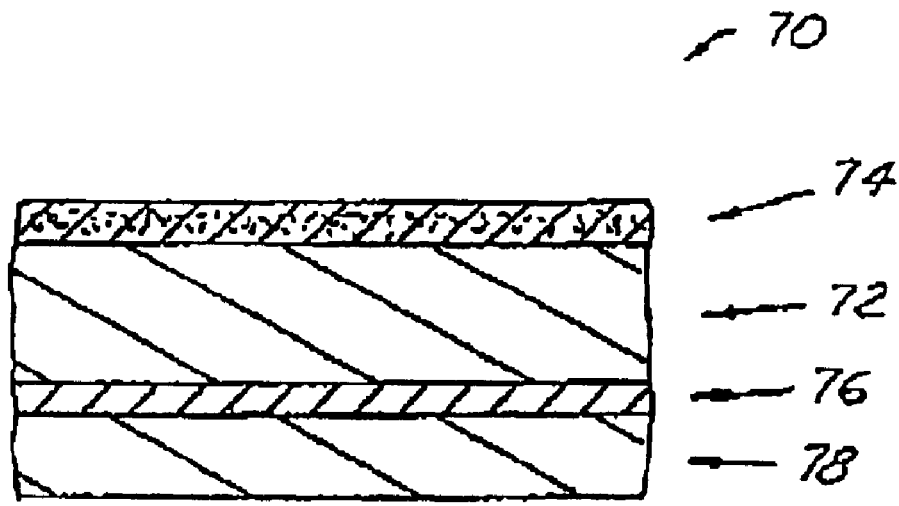
FIG. 7 is a section view of a solar cell coated with sol-gel of FIG. 6 taken along line 7—7.

In FIG. 7, a perspective view of a solar cell 70 coated with sol-gel in accordance with the present invention is shown. In this view, the solar cell 70 has a surface 72 comprised of gallium arsenide. However, it is understood that a solar cell onto which the sol-gel coating 74 is applied, may have a surface comprised of any substrate known to a person skilled in the art, including silicon, gallium arsenide/germanium, indium gallium phosphide/gallium arsenide. The sol-gel coating 74 is applied to the surface 72 of the solar cell 70. The solar cell 70 further comprises a junction 76 wherein many of the positive charges separate from the negative charges. The solar cell 70 also comprises a second surface 78. In another embodiment, not shown here, first and second surfaces are coated with sol-gel coating 74.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

It will be understood that a person skilled in the art may make modifications to the particular embodiments described herein within the scope and intent of the claims. While the present invention has been described as carried out in specific embodiments thereof, it is not intended to be limited thereby, but is intended to cover the invention broadly within the scope and spirit of the claims.

What is claimed is:

1. A method for improving radiation damage resistance of a solar cell comprising:
   providing a solvent;
   introducing into said solvent an organosilane, alkoxide, wherein the ratio of alkoxide to organosilane is about 2 parts by volume organosilane to about 1 part by volume alkoxide, and a catalyst to form a mixture;
   introducing cerium into said solvent, said cerium being in a water soluble form;
   processing said mixture to provide an aqueous sol-gel solution;
   concentrating said solution to form a sol-gel coating;
   providing a solar cell having at least one surface;
   depositing said sol-gel coating onto a surface of the solar cell; and
   curing said sol-gel coating on the surface of the solar cell.

2. The method of claim 1, wherein the solvent is deionized water.

3. The method of claim 1, wherein the organosilane comprises 3-glycidoxypropytrimethoxysilane.

4. The method of claim 1, wherein the catalyst comprises acetic acid.

5. The method of claim 1, further comprising introducing a surfactant into said solvent.

6. The method of claim 1, wherein said cerium is introduced in a form chosen from the group consisting of cerium oxide, cerium acetate, cerium acetylacetonate, cerium 2-ethylhexonate, cerium hydroxide, cerium nitrate, cerium oxalate, cerium stearate, and cerium trifluoroacetylacetonate and mixtures thereof.

7. The method of claim 1, further comprising introducing into said solvent indium tin oxide.

8. The method of claim 1, wherein concentrating said solution comprises evaporating said solvent out of the solution.

9. The method of claim 1, wherein the concentrating of the sol-gel solution provides a sol-gel coating having about 30% weight concentration of the sol-gel solution.

10. The method of claim 1, further comprising the step of filtering said sol-gel coating.

11. The method of claim 10, wherein filtering of said sol-gel coating is by vacuum filtering.

12. A solar cell made by the method of claim 1.

13. The solar cell of claim 12, wherein said surface of said solar cell comprises a semi-conductive material.

14. The method of claim 1, wherein the step of depositing said sol-gel coating comprises spraying said sol-gel coating onto said surface of said solar cell to form said coating.

15. The method of claim 1, wherein the step of depositing said sol-gel coating comprises spraying said sol-gel coating with a high volume low-pressure spray.

16. The method of claim 1, wherein said sol-gel coating measures about 1 to about 10 mils in thickness.

17. The method of claim 1, wherein the solar cell comprises gallium arsenide.

18. The method of claim 1, wherein the solar cell comprises silicon.

19. The method of claim 1, wherein the solar cell comprises gallium arsenide and germanium.

20. The method of claim 1, wherein the solar cell comprises indium gallium and gallium arsenide.

21. A method for improving radiation damage resistance of a solar cell comprising:
   providing a solvent;
   introducing into said solvent an organosilane, alkoxide, wherein the ratio of alkoxide to organosilane is about 2 parts by volume organosilane to about 1 part by volume alkoxide, and a catalyst to form a mixture;
   introducing indium tin oxide into said solvent;
   processing said mixture to provide an aqueous sol-gel solution;
   concentrating said solution to form a sol-gel coating;
   providing a solar cell having at least one surface;
   depositing said sol-gel coating onto a surface of the solar cell; and
   curing said sol-gel coating on the surface of the solar cell.

22. The method of claim 21, wherein the solvent is deionized water.

23. The method of claim 21, wherein the organosilane comprises 3-glycidoxypropytrimethoxysilane.

24. The method of claim 21, wherein the catalyst comprises acetic acid.

25. The method of claim 21, further comprising introducing a surfactant into said solvent.

26. The method of claim 21, further comprising introducing cerium into said solvent, said cerium being in a water soluble form.

27. The method of claim 26, wherein said cerium is introduced in a form chosen from the group consisting of cerium oxide, cerium acetate, cerium acetylacetonate, cerium 2-ethylhexonate, cerium hydroxide, cerium nitrate, cerium oxalate, cerium stearate, and cerium trifluoroacetylacetonate and mixtures thereof.

28. The method of claim 21, wherein concentrating said solution comprises evaporating said solvent out of the solution.

29. The method of claim 21, wherein the concentrating of the sol-gel solution provides a sol-gel coating about 30% weight concentration of the sol-gel solution.

30. The method of claim 21, further comprising the step of filtering said sol-gel coating.

31. The method of claim 30, wherein filtering of said sol-gel coating is by vacuum filtering.

32. A solar cell made by the method of claim 21.

33. The solar cell of claim 32, wherein said surface of said solar cell comprises a semi-conductive material.

34. The method of claim 21, wherein the step of depositing said sol-gel coating comprises spraying said sol-gel coating onto said surface of said solar cell to form said coating.

35. The method of claim 21, wherein the step of depositing said sol-gel coating comprises spraying said sol-gel coating with a high volume low-pressure spray.

36. The method of claim 21, wherein said sol-gel coating measures about 1 to about 10 mils in thickness.

37. The method of claim 21, wherein the solar cell comprises gallium arsenide.

38. The method of claim 21, wherein the solar cell comprises silicon.

39. The method of claim 21, wherein the solar cell comprises gallium arsenide germanium.

40. The method of claim 21, wherein the solar cell comprises indium gallium and gallium arsenide.

* * * * *